United States Patent [19]
Wen et al.

[11] Patent Number: 5,998,817
[45] Date of Patent: Dec. 7, 1999

[54] HIGH POWER PREMATCHED MMIC TRANSISTOR WITH IMPROVED GROUND POTENTIAL CONTINUITY

[75] Inventors: Cheng P. Wen, Viejo; Peter Chu, Hawthorne; Michael R. Cole, Los Angeles; Wah S. Wong, Montebello; Robert F. Wang, Torrance; Liping D. Hou, Palo Verdes, all of Calif.

[73] Assignee: Raytheon Company, Lexington, Mass.

[21] Appl. No.: 08/963,529

[22] Filed: Nov. 3, 1997

[51] Int. Cl.[6] .................................................. H01L 29/80
[52] U.S. Cl. ......................... 257/259; 257/187; 257/275; 330/277
[58] Field of Search ............................... 257/20, 21, 187, 257/259, 275

[56] References Cited

U.S. PATENT DOCUMENTS

| | | |
|---|---|---|
| 4,034,399 | 7/1977 | Drukier et al. . |
| 4,587,541 | 5/1986 | Dalman et al. .............................. 257/21 |
| 5,546,049 | 8/1996 | Wen et al. . |
| 5,760,650 | 6/1998 | Faulkner et al. ......................... 330/286 |

FOREIGN PATENT DOCUMENTS 0 018 091   10/1980   European Pat. Off. .

*Primary Examiner*—Valencia Martin-Wallace
*Attorney, Agent, or Firm*—Leonard A. Alkov; William C. Schubert; Glenn H. Lenzen, Jr.

[57] ABSTRACT

A multicell transistor for use in a circuit has an input ground plane for an input waveguide and an output ground plane for an output waveguide. The multicell transistor includes a gate electrode coupled to the input waveguide, a drain electrode coupled to the output waveguide, and a source electrode coupled to the input ground plane. An output ground strap spaced from the drain electrode couples the output ground plane to the source electrode. A pair of transmission lines are orthogonally connected to and extend from the gate electrode to form a pair of inductors for matching the impedances of the gate electrode and the input waveguide.

24 Claims, 4 Drawing Sheets

HIGH POWER PREMATCHED MMIC TRANSISTOR WITH IMPROVED GROUND POTENTIAL CONTINUITY

BACKGROUND OF THE INVENTION

1. Field of the Invention

The invention relates generally to monolithic microwave integrated circuits (MMICs) and, more particularly, to high power multicell transistor configurations therefor.

2. Description of the Related Art

Ground potential continuity in flip-chip monolithic microwave integrated circuits (MMICs) having multicell transistors is critical for preventing the excitation of undesirable slot line modes, which may lead to signal attenuation and degradation. Attempts to achieve ground potential continuity in prior multicell transistor configurations have, however, been unsatisfactory and/or deficient. As shown in FIG. 1, a conventional multicell transistor configuration 10 (each cell being a separate field effect transistor) includes multiple ground straps or bridges 12 for coupling a source interconnect electrode 14 to a pair of ground planes 16 associated with an input coplanar waveguide (CPW) 18. An additional bridge 20 may span an input transmission line 22 of the input CPW 18 to connect the input ground planes 16. Similarly, yet an additional bridge 24 may span an output transmission line 26 of an output CPW 28 to couple a pair of ground planes 30 associated therewith.

Although the ground potential is equalized to a certain extent by the bridges 12, 20, and 24, the conventional multicell transistor 10 does not provide a suitable connection between the input ground planes 16 and the output ground planes 30. Ground potential continuity between the input and output ground planes 16 and 30 may, therefore, be problematic. Furthermore, the ground path (i.e., between the input and output ground planes 16 and 30) is longer than the RF signal path travelling directly through the multicell transistor 10. As a result, an undesirable inductance is effectively added in series with the multicell transistor 10 at microwave frequencies. Still further, the effective signal path for a transistor cell in the center of the multicell transistor 10 differs from that of a transistor cell near the edge of the multicell transistor 10, thereby decreasing or limiting the power combining efficiency of the multicell transistor 10.

The conventional multicell transistor configuration 10 is also undesirable because the fabrication of each bridge 12, 20, and 24 results in a reduction in the thickness of the transmission line over which the bridge crosses. This reduction is particularly critical for the transmission line 26, which typically carries large DC currents. The resulting high DC current density may lead to undesirable electromigration in the transmission line 26.

Attempts to design around the electromigration problem have led to unfavorable consequences. One approach involves widening the transmission line 26 at the crossover point, which modifies the characteristic impedance of the transmission line unless the slot width (shown in FIG. 1 as "w") is increased accordingly. However, the increased slot width renders the multicell transistor more susceptible to loading effects from the substrate of the flip chip module. Alternatively, simply increasing the thickness of the metal layers universally is also undesirable because it requires drastic and potentially unworkable modifications to the fabrication process and overall MMIC design.

The conventional multicell transistor 10 shown in FIG. 1 is still further undesirable because of the configuration of a pair of transmission lines 32 connected to a gate feed electrode 34 for matching the impedances of the input CPW 18 and the gate feed electrode 34. Such a multicell transistor is then said to be prematched, and the power supplied to the gate feed electrode 34 is maximized. The pair of transmission lines 32 have typically been configured to be inductive at microwave frequencies due to the capacitive nature of the gate feed electrode 34. To this end, each transmission line 32 includes a first section 36 extending from the gate feed electrode 34 and a second section 38 orthogonally connected thereto. Each transmission line 32 further includes a third section 40 having one end orthogonally connected to the second section 38 and another end coupled to a respective metal layer 42 spaced from the input ground plane 16 to form a capacitor. Additional bridges 44 couple the input ground planes 16 to exterior ground planes 45 at each of the orthogonal connections to prevent the formation of undesirable slot line modes.

At microwave frequencies, the respective lengths of the sections 36, 38, and 40 provide the inductance necessary for matching the impedances. The capacitors formed by the metal layers 42 and the input ground planes 16 then provide a short to ground for only the higher (i.e., microwave) frequencies.

As shown in FIG. 1, however, the first section 36 of each transmission line 32 extends outwardly from the gate feed electrode 34. As a result, the conventional multicell transistor 10 matches the impedances at the expense of an increase in the overall width of the multicell transistor 10. The increased overall width, in turn, limits the number of transistors that can be placed in a parallel array on the MMIC chip and, therefore, limits the power of the device fabricated therefrom.

SUMMARY OF THE INVENTION

In accordance with one aspect of the present invention, a multicell transistor is useful in a circuit having an input ground plane for an input waveguide and an output ground plane for an output waveguide. The multicell transistor includes a gate electrode coupled to the input waveguide, a drain electrode coupled to the output waveguide, and a source electrode coupled to the input ground plane. The multicell transistor further includes an output ground strap spaced from the drain electrode for coupling the output ground plane to the source electrode.

The multicell transistor may include an input ground strap spaced from the gate electrode and coupling the input ground plane to the source electrode. The input ground strap may include a first bridge crossing over the gate electrode and the output ground strap may include a second bridge crossing over the drain electrode. The input waveguide may include an input transmission line and the gate electrode may include a gate feed coupled thereto. The input ground strap may be spaced from the gate feed.

In accordance with another aspect of the present invention, a multicell transistor is useful in a circuit having an input coplanar waveguide. The multicell transistor includes a gate feed coupled to the input coplanar waveguide and a pair of transmission lines orthogonally connected to and extending from the gate feed. The pair of transmission lines form a pair of inductors for matching an impedance of the gate feed with an impedance of the input coplanar waveguide.

In a preferred embodiment of the present invention, the pair of transmission lines are capacitively coupled to a ground plane associated with the input coplanar waveguide.

The transmission line is preferably parallel to the input coplanar waveguide. The gate feed may have a pair of ends and each transmission line may be connected to the gate feed near respective ends thereof. The multicell transistor may further include a source interconnect and a plurality of ground straps coupling a pair of ground planes associated with the input coplanar waveguide to the source interconnect. The circuit may further include an output waveguide having an output ground associated therewith and the multicell transistor may also include a further plurality of ground straps coupling the source interconnect to the ground plane associated with the output coplanar waveguide. Each ground strap may include a bridge.

In accordance with yet another aspect of the present invention, a multicell transistor is useful in a circuit having an input ground plane for an input coplanar waveguide. The multicell transistor includes a source electrode coupled to the input ground plane, a gate electrode coupled to the input coplanar waveguide, and a pair of transmission lines coupled to the gate feed to form a pair of inductors. The maximum width of the multicell transistor is determined by the width of the source electrode.

DETAILED DESCRIPTION OF THE INVENTION

Figure 1:
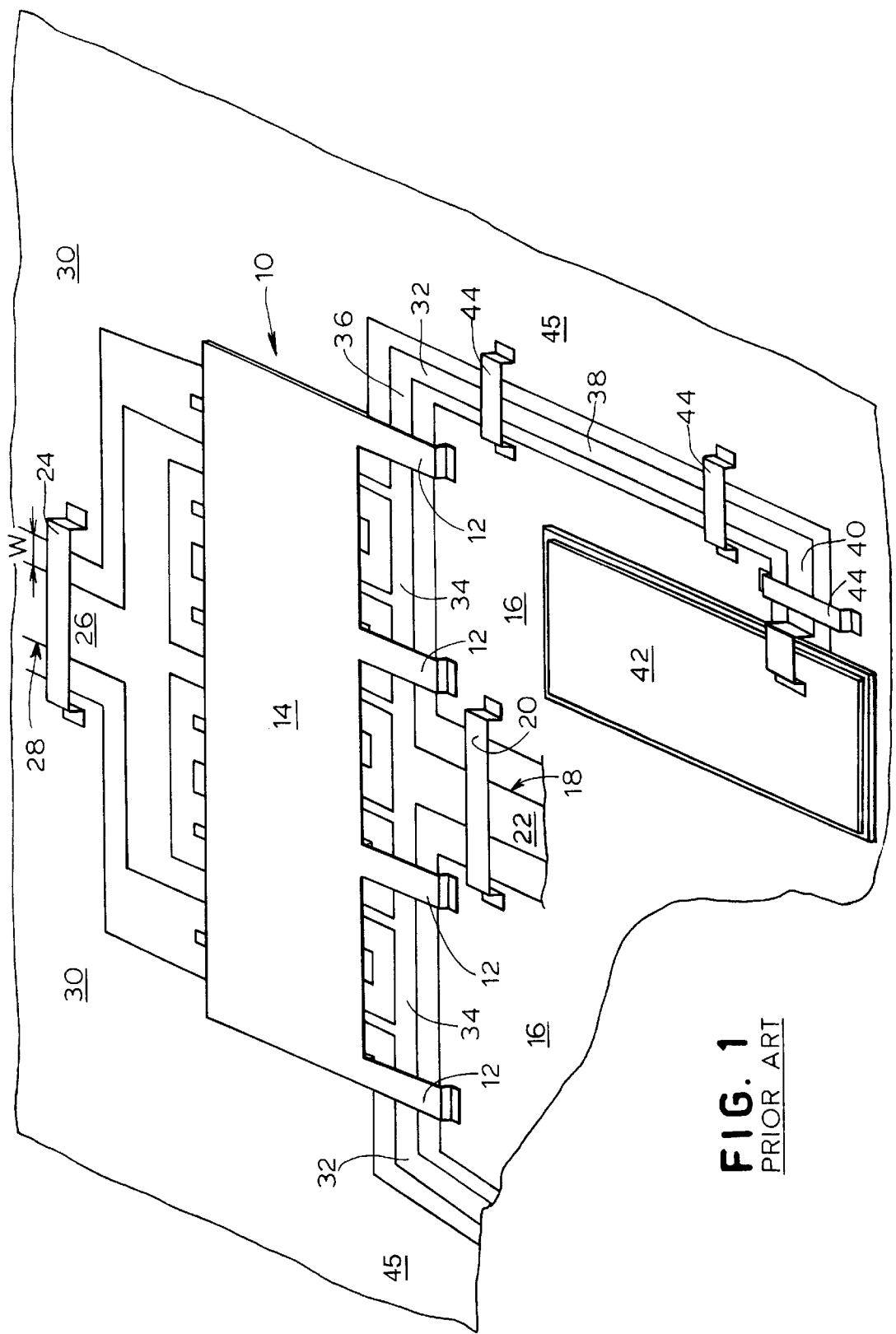
FIG. 1 is a schematic, perspective view of a prior art multicell transistor.
Figure 2:
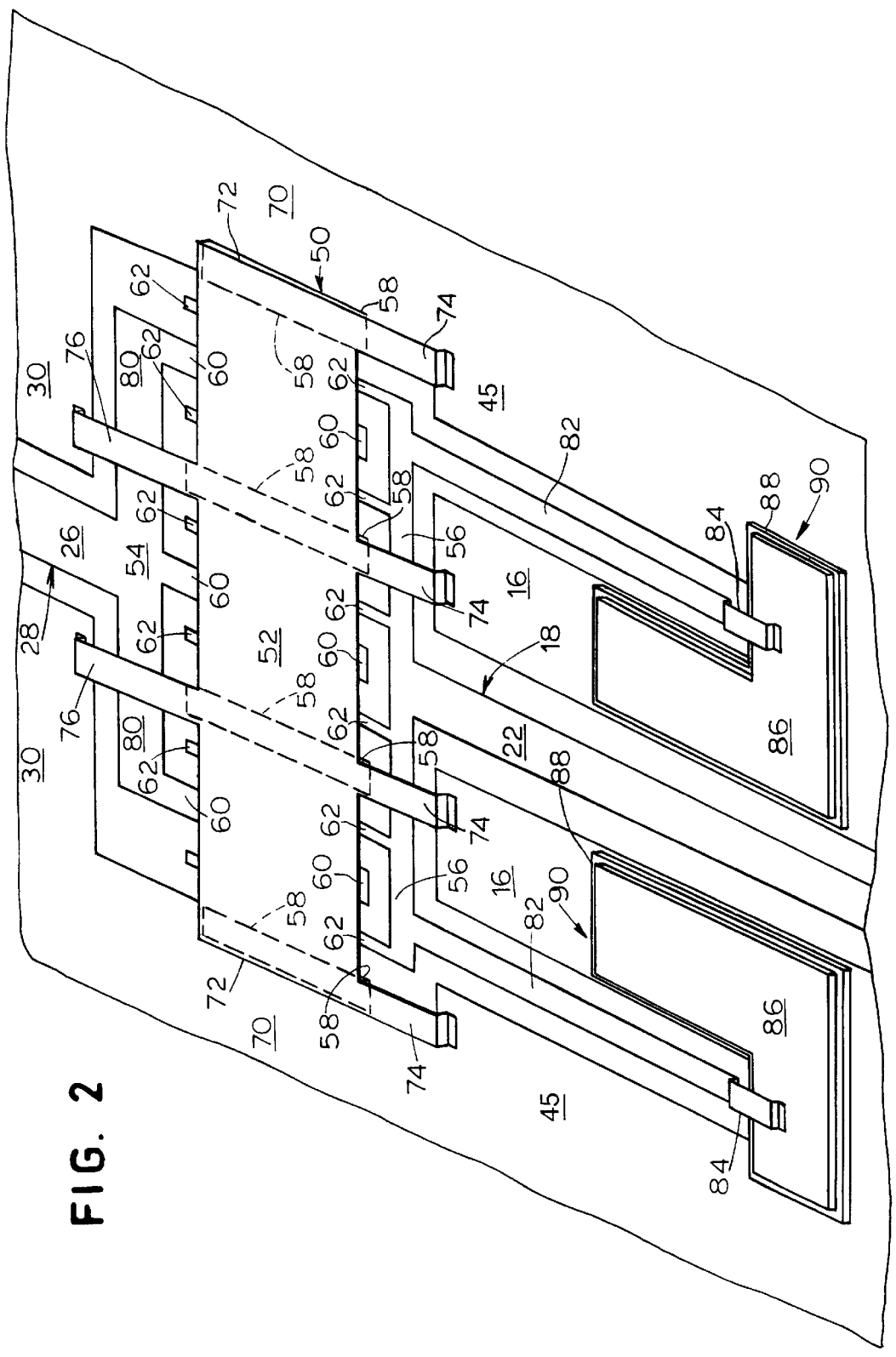
FIG. 2 is a schematic, perspective view of a multicell transistor in accordance with the present invention.

Referring to FIG. 2, a multicell transistor 50 having a configuration in accordance with the present invention is disposed in a conventional MMIC utilizing coplanar waveguides (elements in common with FIG. 1 are identified with like reference numerals). The MMIC is fabricated on a semiconductor substrate (not shown), which may include a multileveled semiconductor heterostructure or any other semiconductor suitable for MMICs and preferably comprises gallium arsenide or indium phosphide. The coplanar waveguides and elements of the multicell transistor comprise patterned metal layers deposited on the semiconductor substrate. Any metal known to those skilled in the art may be utilized, including alloys and multilayered combinations. Preferably, the metal layer utilized in connection with the coplanar waveguides and other elements comprises gold, platinum, and/or titanium.

The multicell transistor 50 includes a source interconnect electrode 52, a collective drain electrode 54, and a gate feed electrode 56 for distributing and collecting signals to an array of transistor cells. Each transistor cell includes a cellular source contact electrode 58 (referred to for simplicity as a "source" and shown partially in phantom), a cellular drain contact electrode 60 (referred to for simplicity as a "drain"), and a cellular gate electrode 62 (referred to for simplicity as a "gate"). While the sources 58, drains 60, and gates 62 as shown in FIG. 2 are arranged to provide six individual field effect transistor (FET) cells, it should be understood that the present invention is not limited to a multicell transistor configuration having a particular number of FETs.

The multicell transistor 50 is shown disposed in a MMIC with the source interconnect electrode 52 and, accordingly, each source 58, coupled to ground. While the present invention is not limited to the manner in which the multicell transistor 50 is disposed in the MMIC, in the embodiment shown in FIG. 2, the source interconnect electrode 52 is coupled to a pair of ground planes 70 adjacent to the multicell transistor 50 by a pair of metal supports 72. The pair of metal supports 72 space the source interconnect electrode 52 from the drains 60 and the gates 62 and also provide contact to the outermost sources 58 in the array of transistor cells. The source interconnect electrode 52 is further supported by each individual source 58.

In accordance with the present invention, the source interconnect electrode 52 is further coupled to ground via a plurality of ground straps 74. In the embodiment shown in FIG. 2, the plurality of ground straps 74 comprise four bridges, but may include a different number as necessary. Each ground strap 74 or bridge is spaced from the gate feed electrode 56 to couple the source interconnect electrode 52 to the input ground plane 16 or the exterior ground plane 45 and provide ground potential continuity therebetween. The source interconnect electrode 52 is still further coupled to ground via a further plurality of ground straps 76 spaced from the collective drain electrode 54. The ground straps 74 and 76 and the source interconnect electrode 52 provide improved ground potential continuity between the input ground planes 16, the exterior ground planes 45, and the output ground planes 30. Moreover, the ground straps 74 and 76 and the source interconnect 52 form a ground path having a length commensurate with the length of the RF signal path for the multicell transistor 50, thereby removing the series inductance inherent in prior transistor configurations. As a further consequence, uniformity is also achieved between transistor cells near the center of the multicell transistor 50 and those near the adjacent ground planes 70 (i.e., the outermost transistor cells).

The collective drain electrode 54 includes a pair of arms 80 coupling one or more of the drains 60 to the transmission line 26. The drain electrode arms 80 extend outwardly from the area where the transmission line 26 and the collective drain electrode 54 meet. In the embodiment of the present invention shown in FIG. 2, the two ground straps 76 cross the collective drain electrode 54 as near as possible to that area. As a result, the ground straps 76 and the source interconnect electrode 52 provide a relatively short connection between the output ground planes 30 to equalize the ground potential therebetween. As a further result, the bridge 24 of the conventional multicell transistor 10 shown in FIG. 1 is no longer necessary and, therefore, only the drain electrode arms 80 comprise portions thinned by the formation of ground straps. In the embodiment shown in FIG. 2, the positioning of the ground straps 76 limits the DC drain current that must flow through the thinned portions of the drain electrode arms 80 to only one-third of the DC drain current carried by the transmission line 26. In contrast, in the conventional multicell transistor of FIG. 1, 100% of the DC drain current must flow through such a thinned portion. Consequently, the multicell transistor 50 according to the present invention will include thinned portions with a lower DC current density, thereby alleviating electromigration problems without any sacrifices in ground potential continuity.

With continued reference to FIG. 2, the gate feed electrode 56 couples the transmission line 22 and the input signal carried thereby to the gates 62 of each of the transistor cells. Because each transistor cell is a field effect transistor, the impedance of the gate feed electrode 56 (as seen by the transmission line 22) is capacitive. In the interest of matching the impedance of the gate feed electrode 56 with the impedance of the transmission line 22, a pair of transmission lines 82 are orthogonally connected to the gate feed electrode 56 near the ends thereof. Each transmission line 82 is coupled via a respective bridge 84 to a respective metal layer 86 spaced from the input ground planes 16 by a dielectric spacer layer 88, which may comprise, for example, silicon nitride, silicon dioxide, or any other dielectric known to those skilled in the art to be easily deposited upon a metal surface. The dielectric spacer layer 88 may have any size or shape, but preferably is commensurate in size with the metal layer 86 and most preferably covers an area slightly larger than the metal layer 86.

Each metal layer 86 and the respective portions of the input ground planes 16 form a pair of capacitors 90 that provide a short to ground for any microwave frequency component of the signal on the transmission lines 82. The metal layer 86 may take on a variety of shapes in the interest of optimizing the capacitance of each capacitor 90. Because of this high frequency short to ground and the orthogonal connection between the pair of transmission lines 82 and the gate feed electrode 56, the length of the transmission lines 82 can be set to form a pair of inductors in parallel with the capacitance of the gate feed electrode 56. As is known to those skilled in the art, the wavelength of the microwave signals to be provided to the multicell transistor 50 and the capacitance between the gate feed electrode 56 and the source interconnect electrode 58 will be determinative of the length of the transmission lines 82.

Each transmission line 82 also extends orthogonally from the gate feed electrode 56 between an input ground plane 16 and an exterior ground plane 45 as a coplanar waveguide. In this manner, each transmission line 82 runs parallel with the transmission line 22 and does not increase the maximum width of the multicell transistor 50, which is determined by the width of the source interconnect electrode 52 (i.e., the width of the array of transistor cells). Similarly, the shape and size of the metal layer 86 is selected such that the capacitors 90 also do not increase the width of the multicell transistor 50. With no extra space taken up by the transmission lines 82 used to prematch each multicell transistor 50, the number of transistors can be maximized on the MMIC chip.

Figure 3:
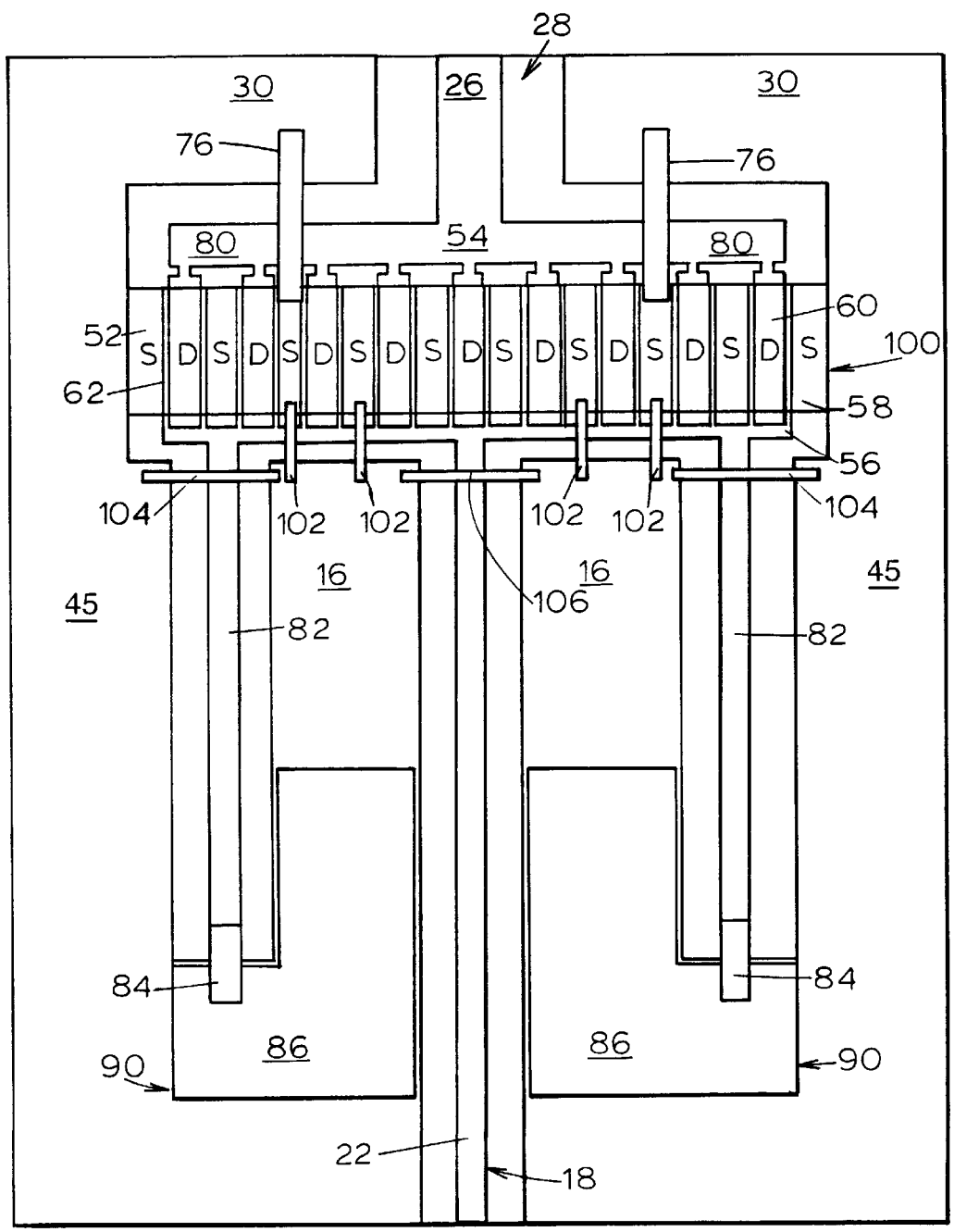
FIG. 3 is a schematic, plan view of a multicell transistor in accordance with an alternative embodiment of the present invention.

Referring now to FIG. 3, a multicell transistor 100 in accordance with another embodiment of the present invention includes an increased number of transistor cells and additional ground straps for further improvements in ground potential continuity. Elements in common with FIG. 2 have been given like reference numerals and the source interconnect electrode 52 has been removed to reveal the underlying source, drain and gate elements, which have been labeled with either the reference numeral (e.g., each gate 62 and the gate feed electrode 56) or a representative letter (e.g., "S" for source and "D" for drain).

More particularly, the multicell transistor 100 includes a plurality of ground straps 102 spaced from and crossing the gate feed electrode 56 to couple the source interconnect electrode 52 to the input ground planes 16. The input ground planes 16 are also coupled to the exterior ground planes 45 by a pair of ground straps 104 spaced from and crossing the transmission lines 82. A ground strap 106 couples together the pair of input ground planes 16 separated by the input CPW 18. Each of the ground straps 102, 104, and 106 help reduce (i.e., attenuate) any slot line modes or other higher order modes generated by the orthogonal connections between the input CPW 18 and the gate feed electrode 56 and between the transmission lines 82 and the gate feed electrode 56.

The ground straps 76 of the multicell transistor 100 are spaced from each arm 80 of the collective drain electrode 54 and disposed, as in the previous embodiment (FIG. 2), as near as possible to the transmission line 26 to achieve ground potential continuity between the pair of output ground planes 30. However, in this embodiment, only four (4) of nine (9) drains 60 contribute current to the drain electrode arms 80 that must flow through the thinned portions thereof. As a result, less than one-fourth (22.2%) of the DC drain current flowing through the transmission line 26 must flow through each thinned portion of the drain electrode arms 80.

Figure 4:
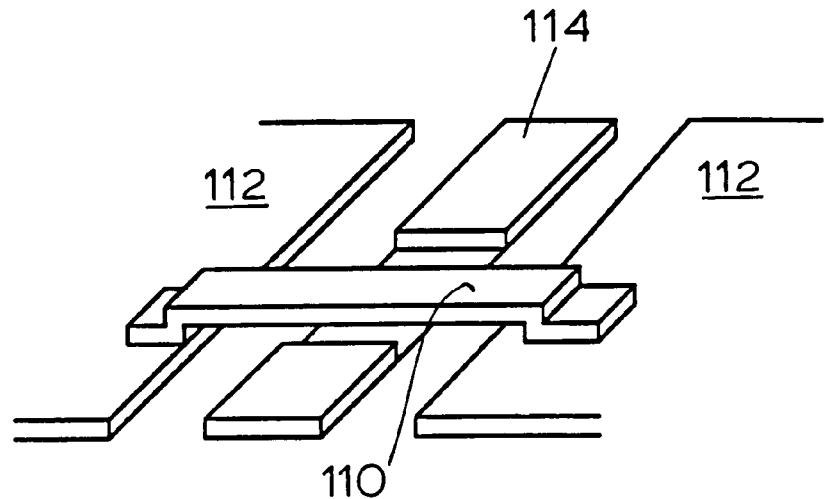
FIG. 4 is a schematic, perspective view of a coplanar waveguide having an over-crossing ground strap.
Figure 5:
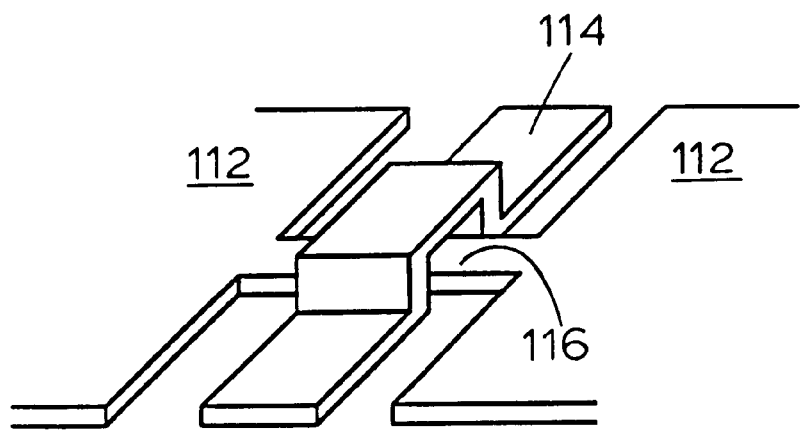
FIG. 5 is a schematic, perspective view of a coplanar waveguide having an under-crossing ground strap.

Referring now to FIGS. 4 and 5, each above-mentioned ground strap may comprise an over-crossing ground strap 110 (FIG. 4) for coupling a pair of ground planes 112. The over-crossing ground strap 110 forms a bridge over a transmission line 114 of the CPW or other electrode separating the pair of ground planes 112. Alternatively, each above-mentioned ground strap may comprise an under-crossing ground strap 116 (FIG. 5) for coupling the pair of ground planes 112. In that event, the transmission line 114 includes a bridge portion 118 spaced from the under-crossing ground strap 116.

It should be understood that the invention is not limited to the particular shapes of the electrodes, transmission lines, and ground straps as described above and shown in FIGS. 2–5, unless specifically noted otherwise. The elements illustrated in FIGS. 2–5 are not necessarily shown to scale. Furthermore, the multicell transistors of the present invention may be fabricated in accordance with any process known to those skilled in the art. In particular, the above-described ground straps and other metal elements or layers may be formed according to conventional techniques, including electrolytic gold plating, metal evaporation, metal sputtering, or any combination thereof in conjunction with any necessary photolithography. Lastly, the actual dimensions of the elements of the multicell transistors described above, including the thicknesses of any layers thereof, are not pertinent to the scope of the present invention, and should not be limiting in any fashion. However, the overall thickness of the metallization layer (the thickness of the ground straps being a fraction thereof) is preferably on the order of three times the skin depth at the RF signal frequency.

Numerous other modifications and alternative embodiments of the invention will be apparent to those skilled in the art in view of the foregoing description. Accordingly, this description is to be construed as illustrative only. The details of the structure may be varied substantially without departing from the spirit of the invention, and the exclusive use of all modifications which are within the scope of the appending claims is reserved.

What is claimed is:

1. A multicell transistor for use in a circuit having an input ground plane for an input waveguide and an output ground plane for an output waveguide, the transistor comprising:

a gate electrode coupled to the input waveguide;

a drain electrode coupled to the output waveguide;

a source electrode coupled to the input ground plane;

an input ground strap spaced from the gate electrode and coupling the input around plane to the source electrode; and an output ground strap spaced from the drain electrode and coupling the output ground plane to the source electrode.

2. The multicell transistor of claim 1, wherein:
the input ground strap comprises a first bridge crossing over the gate electrode; and
the output ground strap comprises a second bridge crossing over the drain electrode.

3. The multicell transistor of claim 1, wherein the circuit has a further input ground plane and a further output ground plane, the multicell transistor further comprising:
a further input ground strap spaced from the gate electrode and coupling the further input ground plane to the source electrode; and
a further output ground strap spaced from the drain electrode and coupling the further output ground plane to the source electrode.

4. The multicell transistor of claim 3, further comprising an array of transistor cells wherein each transistor cell comprises a cellular source electrode, a cellular drain electrode, and a cellular gate electrode.

5. The multicell transistor of claim 4, wherein:
the output waveguide comprises an output transmission line;
the drain electrode comprises a pair of drain electrode arms extending from the output transmission line; and
the first-named output ground strap and the further output ground strap are spaced from each of the pair of drain electrode arms, respectively.

6. The multicell transistor of claim 4, wherein the source electrode comprises a source electrode interconnect, which couples each cellular source electrode to a pair of ground planes adjacent to respective ends of the transistor cell array, respectively.

7. The multicell transistor of claim 4, wherein:
the input waveguide comprises an input transmission line;
the gate electrode comprises a gate feed coupled to the input transmission line and further coupled to each respective cellular gate electrode; and
the first-named input ground strap and the further input ground strap are spaced from the gate feed.

8. The multicell transistor of claim 7, further comprising a pair of inductors, each inductor comprising a transmission line orthogonally connected to the gate feed and coupled to ground via a respective capacitor.

9. The multicell transistor of claim 8, wherein each capacitor includes a metal layer spaced from the respective input ground plane.

10. A multicell transistor for use in a circuit having an input ground plane for an input coplanar waveguide and an output ground plane for an output coplanar waveguide, the multicell transistor comprising:
a source interconnect;
an array of transistor cells, each transistor cell having a source coupled to the source interconnect and a respective drain;
a gate feed coupled to the input coplanar waveguide;
a collective drain electrode coupled to the output coplanar waveguide and further coupled to each respective drain;
a plurality of input ground straps wherein each input ground strap is spaced from the gate feed and couples the input ground plane to the source interconnect; and
a plurality of output ground straps wherein each output ground strap is spaced from the collective drain electrode and couples the output ground plane to the source interconnect.

11. The multicell transistor of claim 10, wherein the collective drain electrode comprises a respective thinned portion associated with each output ground strap and wherein less than one-fourth of the drains provide current that flows through any respective thinned portion.

12. A multicell transistor for use in a circuit having an input coplanar waveguide, the multicell transistor comprising:
a gate feed coupled to the input coplanar waveguide; and
a pair of transmission lines orthogonally connected to and extending from the gate feed to form a pair of inductors for matching an impedance of the gate feed with an impedance of the input coplanar waveguide.

13. The multicell transistor of claim 12, wherein the pair of transmission lines are capacitively coupled to a ground plane associated with the input coplanar waveguide.

14. The multicell transistor of claim 12, wherein each transmission line is parallel to the input coplanar waveguide.

15. The multicell transistor of claim 12, wherein the gate feed has a pair of ends and each transmission line is connected to the gate feed near respective ends thereof.

16. The multicell transistor of claim 12, further comprising:
a source interconnect; and
a plurality of ground straps coupling a pair of ground planes associated with the input coplanar waveguide to the source interconnect.

17. The multicell transistor of claim 16, wherein the circuit further includes an output waveguide having an output ground plane associated therewith, the multicell transistor further comprising a further plurality of ground straps coupling the source interconnect to the output ground plane.

18. The multicell transistor of claim 17, wherein each ground strap comprises a bridge.

19. A multicell transistor for use in a circuit having an input ground plane for an input coplanar waveguide, the multicell transistor comprising:
a source electrode coupled to the input ground plane wherein the source electrode has a width;
a gate electrode coupled to the input coplanar waveguide; and
a pair of transmission lines coupled to the gate electrode to form a pair of inductors;
wherein the multicell transistor has a maximum width determined by the source electrode width.

20. The multicell transistor of claim 19, wherein the pair of transmission lines are orthogonally connected to and extend from the gate electrode.

21. The multicell transistor of claim 19, further comprising a pair of capacitors coupling the pair of transmission lines to the input ground plane, respectively.

22. The multicell transistor of claim 19, wherein each transmission line is parallel to the input coplanar waveguide.

23. The multicell transistor of claim 19, further comprising:
a drain electrode coupled to an output transmission line having an output ground plane associated therewith;
an input ground strap spaced from the gate electrode and coupling the source electrode to the input ground plane; and
an output ground strap spaced from the drain electrode and coupling the source electrode to the output ground plane.

24. The multicell transistor of claim 23, wherein:

the input ground strap comprises a first bridge crossing over the gate electrode; and the output ground strap comprises a second bridge crossing over the drain electrode.

* * * * *